United States Patent [19]

Berard

[11] 4,091,430
[45] May 23, 1978

[54] GUARD CIRCUIT FOR HIGH IMPEDANCE SIGNAL CIRCUITS

[75] Inventor: Clement Alphonse Berard, Trenton, N.J.

[73] Assignee: RCA Corporation, New York, N.Y.

[21] Appl. No.: 741,069

[22] Filed: Nov. 11, 1976

[51] Int. Cl.[2] .............................................. H02H 7/20
[52] U.S. Cl. ................................. 361/43; 307/200 A; 307/303; 330/207 P
[58] Field of Search ................................. 361/43, 42, 1; 307/200 A, 200 B, 303, 304, 92, 94; 330/207 P, 76, 27, 28; 340/248 N

[56] References Cited

U.S. PATENT DOCUMENTS 3,980,928    9/1976    Newington et al. ............... 361/43

Primary Examiner—J D Miller
Assistant Examiner—Patrick R. Salce
Attorney, Agent, or Firm—H. Christoffersen; Joseph D. Lazar

[57] ABSTRACT

Current leakage from high impedance signal circuits or networks of the type useful in the feedback paths of operational amplifiers is inhibited or prevented by circuit guarding. A lower impedance, parallel path provides a guard circuit that protects the signal circuit elements from excessive self-generated current leaks during closed loop use of operational amplifiers. The guard circuit includes equal potential nodes in the lower impedance path that are juxtaposed to corresponding nodes of the signal circuit elements. Current leakages, that may occur in the signal path, are mostly intercepted by the lower impedance guard circuit preventing the formation of electric fields or current leakage paths that would affect normal signal circuit performance.

6 Claims, 3 Drawing Figures

GUARD CIRCUIT FOR HIGH IMPEDANCE SIGNAL CIRCUITS

BACKGROUND OF THE INVENTION

1. Field of the Invention

The present invention relates generally to circuit guarding and particularly to circuit guarding to protect circuits associated with integrated circuits operational amplifiers from internal (self-generated) leakage currents.

Techniques for shielding or guarding circuits or networks from the effects of leakage currents are well known. In general there are two types of guarding circuits used to prevent or inhibit leakage currents. One type, known as passive guarding, utilizes one or more conductors positioned adjacent to the active or signal circuits of concern and grounded to a common bus to serve as a shield, receptor, or sink of stray currents due to leakage effects. The other type is an active guard circuit which utilize conductors suitably placed adjacent to the active or signal circuits of concern, but provided with voltage potentials derived from the circuit of concern itself and arranged to divert leakage currents in such a manner as to minimize the effect of such currents on the circuit of concern. For a discussion of several design techniques, see an article entitled "New Design Techniques for FET Op Amps" published in the National Semiconductor Application Note (pages 5 and 6) AN-63 (March 1972).

Nevertheless, in certain applications, such as in air pollution control, medical electronics, space, instrumentation devices of high sensitivity and, in general, any application in which a high impedance circuit may be subject to deleterious effects of leakage current are still of concern, there is a need for a guard circuit that will minimize if not inhibit leakage currents, particularly, in the environment of printed circuit boards, hybrid circuit substrates, and integrated circuits.

DETAILED DESCRIPTION OF THE PREFERRED EMBODIMENT

Figure 1:
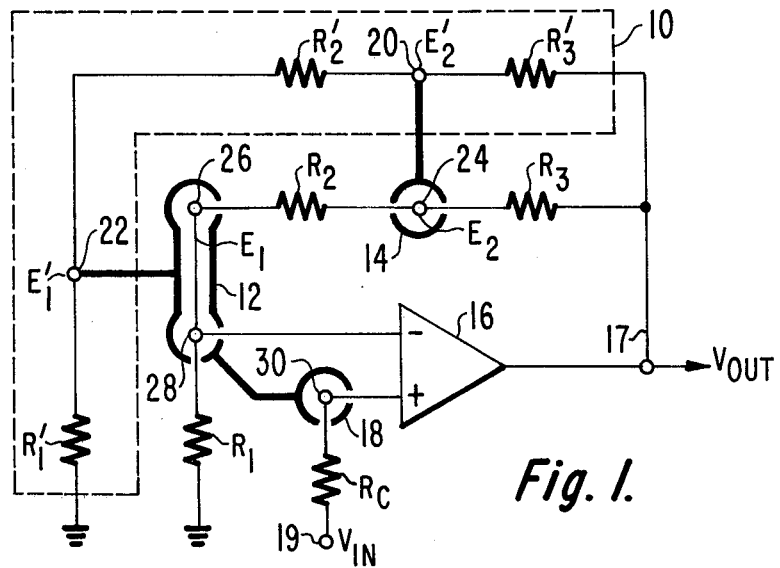
FIG. 1 illustrates a non-inverting amplifier schematic diagram embodying a circuit guard of the present invention.

FIG. 1 illustrates a guard circuit 10 formed of resistor components $R_1'$ and $R_2'$ and $R_3'$ joined at "nodes" $E_1'$ and $E_2'$ defined by the connection between the associated resistors and coupled between ground and output terminal 17 of operation amplifier (op-amp) 16. The signal circuit elements for op-amp 16 include resistors $R_1$, $R_2$, and $R_3$ joined at corresponding nodes $E_1$ and $E_2$ and coupled between ground, inverting (−) input terminal of op-amp 16, and output terminal 17 of op-amp 16 and compensation resistor $R_c$ coupled between terminal 19 and the non-inverting (+) terminal of op-amp 16.

The resistors of both the signal circuit and the guard circuit are of the discrete type suitably disposed on a printed circuit board. Their respective leads are connected to printed conductors or printed circuit traces 17 20, 22, 24, 26, 28, and 30 formed or mounted on the board.

Corresponding terminals of the guard circuit and signal circuit, as will be explained, are arranged to be at the same potential so as to provide an environment that will inhibit leakage currents from the signal circuit at the junctions of the resistor elements. These terminal and junction areas are termed herein "nodes".

Nodes $E_1$, $E_2$, $E_1'$, and $E_2'$ are each formed of an arrangement of conductors disposed on the circuit board and surrounding each terminal in such a manner as to isolate the protected terminal from the remaining portion of the board to thereby prevent surface current from flowing to or from the terminal. Such arrangements are known in the art as "guards."

Figure 2:
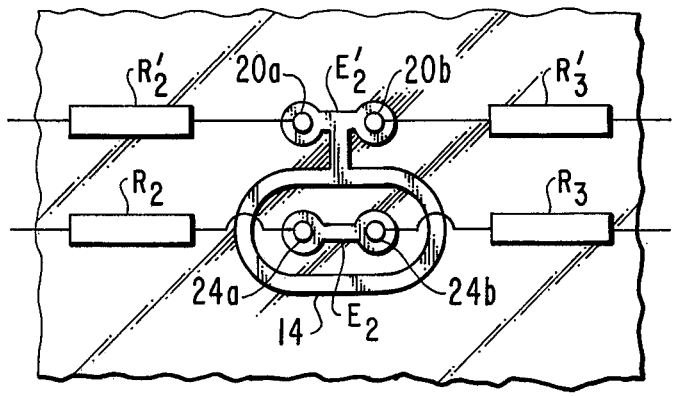
FIG. 2 illustrates a printed circuit board embodying a portion of the circuit guard shown in FIG. 1.

FIG. 2 illustrates a typical implementation of nodes $E_2$ and $E_2'$ on a printed circuit board layout for the circuit of FIG. 1 as illustrated. Note that the leads from resistors $R_2$ and $R_3$ terminate at node $E_2$ at their respective terminals 24a and 24b but do not touch guard conductor 14. In the actual physical construction of a double-sided printed circuit board array, such guard conductors should be repeated on the opposing side of the printed circuit board because leakage currents can occur on either side of the board so long as signal circuit potentials exist to generate an electric field.

The physical dimensions of the guard circuit arrangement is determined by the configuration of the circuit and other factors well known in the art.

Conductor 14 serves as a guard that isolates node $E_2$ of the signal circuit disposed in close proximity to node $E_2$ and is extended to terminate at node $E_2'$ of the guard circuit. Guard conductor 14 intercepts any current leakage that may exist due to the potential of node $E_2$ and provides a low resistance path for such leakage current into the guard path 10.

Conductor 12 of FIG. 1 also serves as a guard that isolates the signal path at node $E_1$ between the terminals of resistors $R_2$ and $R_1$. Guard 12 is used to intercept any leakage currents that may exist due to the potential of node $E_1$ and direct the leakage flow towards node $E_1'$.

Conductor 18 in like manner serves as a guard for the non-inverting (+) input of op-amp 16 to intercept or inhibit leakage current at or about the (+) input. Resistor $R_c$ is coupled between the (+) input of op-amp 16 and terminal 19 to which an input voltage $V_{in}$ is applied. When the voltages $V_{in}$ and $V_{out}$ are within the linear range of op-amp 16 conductor 18 is essentially at the same potential as node $E_1$ and conductor 12, because the negative feedback effects maintain a substantially zero voltage difference between the input terminals of op-amp 16. Thus guarding of both node $E_1$ and terminal 30 is achieved with guard conductors 12 and 18 connected together.

Guard circuit 10 is arranged to generate voltages at the nodes ($E_1'$, $E_2'$, etc.), and thus at the guard conductors, (12, etc.), that are substantially equal to the respective voltages at corresponding terminals (26, 28, 30, 24, etc.) of the signal circuit (op-amp 16 and feedback resistors $R_3$ and $R_2$, etc.). In general, the output voltage ($V_{out}$) of the op-amp circuit of FIG. 1 may be determined from the relation:

$$V_{out} = 1 + \frac{R_2 + R_3}{R_1} V_{in} \tag{1}$$

where $R_1$, $R_2$, and $R_3$ are the ohmic values of the resistors indicated, and $V_{in}$ is the input signal voltage. According to the invention, the guard circuit 10 relation to the signal circuit is arranged such that:

$$R_1/R_1' = R_2/R_2' = /R_3/R_3' = k \qquad (2)$$

where $$k >> 1$$

The lower impedance of guard circuit (10) is necessary so that leakage currents do not substantially disturb the voltages at nodes $E_1'$ etc. of the guard circuit.

The relative value of the corresponding resistors of the guard circuit are conveniently determined by the relation:

$$R_1' = R_1/K; R_2' = R_2/K; R_3' = R_3/K \qquad (3)$$

Although the embodiment described utilizes resistive components, it should be understood that since any impedance circuit arrangement may be used for the signal circuit, the leakage compensation or inhibiting guard circuit (10) will also be formed of corresponding impedance components of the general form $Z = R + jX$. Thus, for uses of an inductive component, $L_n' = L_n/K$, and for a capacitive component, $C_n' = K\ C_n$, where the subscript $(n)$ indicates the nth component of a general network. The particular guard circuit or network arrangement needed to meet a particular application of this invention will be readily apparent to those skilled in this art following the principles described above.

Figure 3:
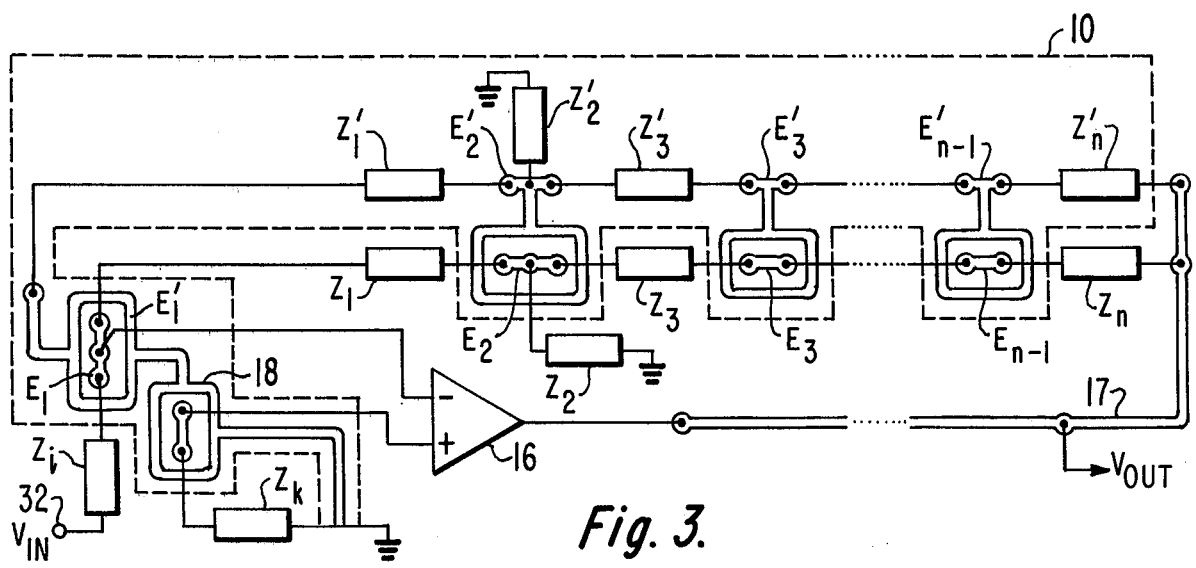
FIG. 3 illustrates an inverting amplifier arrangement that includes a circuit guard according to the invention.

FIG. 3 illustrates a typical implementation of guard network (10) on a printed circuit board layout for a general case of "$n$" elements in a feedback circuit of an inverting amplifier configuration. The lower impedance guard circuit elements from $Z_1'$ to $Z_n'$ operate so that nodes $E_1'$ through node $E_{n-1}'$ are at the same voltage potential as nodes $E_1$ through $E_{n-1}$ of the signal circuit. As described above, the impedance components in the guard circuit (10) must be of a lower impedance value so that leakage current will tend to flow in the guard circuit thereby diverting any possible deleterious leakage current away from the signal circuit. Resistor $Z_k$ is used as a compensation resistor to compensate for input voltage offset while guard conductor 18 is used to intercept or inhibit leakage current which may interfere with the non-inverting (+) input of amplifier 16.

A circuit made in accordance with FIG. 1 had the following values for the impedances:

$R_2, R_3 = 20$ Megohms
$R_1 = 1$ Megohm
$R_2', R_3' = 200$ Kilohms
$R_1' = 10$ Kilohms
$R_c = 1$ Megohm

What is claimed is:

1. A circuit for guarding high impedance signal paths from leakage currents, said circuit having a plurality of elements being connected at terminals defining nodes of the circuit, said circuit being in an environment wherein leakage currents may affect said circuit in the vicinity of said nodes, comprising:
   a. guard means for establishing corresponding potential nodes in a path that parallels the signal path, said nodes being of a potential level substantially the same as the potential level that exists at the respective nodes in said signal path; said guard means including;
   b. impedance elements connected between said nodes of said parallel path of impedance values substantially smaller than corresponding impedances of said signal path for maintaining said nodes at substantially the same potential level as corresponding nodes of the signal path;
   c. conductor means extending from each of said nodes of said parallel guard means path to the respective corresponding nodes of said signal path, said conductor means being formed to substantially surround said signal path nodes so as to substantially isolate said signal path nodes from leakage currents;
   said conductor means being at substantially the same voltage potential as the potential of said signal path nodes.

2. A circuit in accordance with claim 1, wherein said signal path and parallel guard means path consists essentially of impedance elements, said elements in said parallel current path having impedance values that are proportional to corresponding impedance elements in said signal path.

3. A circuit according to claim 1 where said circuit is formed on a substrate in which conductors are printed thereon and elements of said circuit are connected to said conductors at an associated one of said nodes.

4. A circuit according to claim 1 wherein the impedance elements of said signal path are each of the form $Z = R + jX$ and the corresponding impedance elements of said guard means are each of the form $Z/k = (R + jX)/k$ where $k$ is a number much greater than unity.

5. A circuit in accordance with claim 3 including an operational amplifier mounted on said substrate.

6. A circuit according to claim 5 wherein said operational amplifier has an inverting input terminal and a non-inverting input terminal, and an output terminal, said signal path being connected between said output terminal and a reference ground, said parallel guard means path being also connected between said output terminal and said ground, and further including an input impedance connected to said non-inverting terminal of said operational amplifier,
   said conductor means further including means to surround the connection of said input impedance to said operational amplifier.

* * * * *